United States Patent
Couleur et al.

(10) Patent No.: US 10,009,019 B2
(45) Date of Patent: Jun. 26, 2018

(54) CIRCUIT AND METHOD TO GENERATE FREQUENCY PROPORTIONAL CURRENT

(71) Applicant: Texas Instruments Incorporated, Dallas, TX (US)

(72) Inventors: Michael Couleur, Rottach-Egern (DE); Neil Gibson, Freising (DE); Antonio Priego, Freising (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days. days.

(21) Appl. No.: 15/282,957

(22) Filed: Sep. 30, 2016

(65) Prior Publication Data
US 2018/0097513 A1    Apr. 5, 2018

(51) Int. Cl.
| | |
|---|---|
| G05F 3/02 | (2006.01) |
| H03K 7/06 | (2006.01) |
| H02M 3/07 | (2006.01) |
| H03K 4/52 | (2006.01) |
| H03L 7/081 | (2006.01) |

(52) U.S. Cl.
CPC ............ H03K 7/06 (2013.01); H02M 3/07 (2013.01); H03K 4/52 (2013.01); H03L 7/0812 (2013.01)

(58) Field of Classification Search
CPC .. H03K 7/06; H03K 4/52; H02M 3/07; H03L 7/0812
USPC ........................................................ 327/536
See application file for complete search history.

(56) References Cited

U.S. PATENT DOCUMENTS

| | | | | |
|---|---|---|---|---|
| 8,164,318 | B2* | 4/2012 | Sasaki | H02M 3/157 323/222 |
| 8,368,374 | B2* | 2/2013 | Hachiya | H02M 3/1588 323/271 |
| 8,816,656 | B2 | 8/2014 | Couleur et al. | |
| 8,829,874 | B2 | 9/2014 | Gibson | |
| 9,467,043 | B2* | 10/2016 | Xue | H02M 3/157 |
| 2007/0236188 | A1* | 10/2007 | Gibson | H02M 3/1563 323/225 |
| 2010/0308784 | A1* | 12/2010 | Scoones | H02M 1/32 323/282 |
| 2013/0063104 | A1 | 3/2013 | Gibson | |

OTHER PUBLICATIONS

Texas Instruments, TPS6303x High Efficiency Single Inductor Buck-Boost Converter With 1-A Switches; Oct. 2008; Revised Oct. 2015; 27 pages.

* cited by examiner

*Primary Examiner* — Ryan Jager
(74) *Attorney, Agent, or Firm* — Tuenlap D. Chan; Charles A. Brill; Frank D. Cimino

(57) ABSTRACT

Disclosed examples include self-biased DLL circuits to generate a bias current signal proportional to a repetition frequency of a first signal representing continuous switching or discontinued switching operation of the DC-DC converter. The DLL circuit includes a monostable multivibrator to provide a pulse output signal in response to an edge of the first signal with a pulse duration set by a control current signal, a phase detector to provide output signals according to a phase difference between an edge of the pulse output signal and the first signal, and an output circuit to provide an output signal according to the phase detector output signals and according to an offset signal, to provide the bias current signal according to the output signal, and to provide the control current signal according to the output signal.

12 Claims, 4 Drawing Sheets

CIRCUIT AND METHOD TO GENERATE FREQUENCY PROPORTIONAL CURRENT

BACKGROUND

DC-DC converters employ switch circuits to convert input power into a controlled DC output to drive a load. Many DC-DC converters operate in different modes depending on the output current requirement. Continuous conduction mode (CCM) is commonly used for relatively high output current requirements, where the converter switches provide generally continuous current to the load. In most applications, where efficiency at mid/low load currents has priority over other performance parameters, different Discontinuous Conduction Mode (DCM) techniques are used. At those load current levels, switching losses are the main contributors to the overall power loss. Switching losses are proportional to the switching frequency therefore most of the DCM techniques to improve efficiency at mid/low load currents, like pulse frequency modulation (PFM) or pulse skipping, keep the converter switches off for a certain amount of time, i.e. effectively reduce the switching frequency. During PFM operation, at very low currents, the quiescent current draw of the converter circuitry is the primary loss mechanism with respect to energy efficiency. Accordingly, it is desired that the circuits draw as little current as possible from the supply during pauses between switching operations. However the converter control circuits need to be able to wake up and have sufficient bandwidth when it is required to resume transmitting energy to the output capacitor. If the quiescent current during the PFM pause is too low, it cannot be guaranteed that the circuits will timely wake up with the required bandwidth. Quiescent current levels can be set to accommodate a specific bandwidth at a given PFM pause repetition frequency, but the length of the pause period during which the converter is idle may vary by several time decades during PFM operation.

SUMMARY

Disclosed examples provide DC-DC controller circuits and bias current circuits including a self-biased delay lock loop (DLL) circuit to generate a bias current signal proportional to a repetition frequency of a first signal representing continuous switching or discontinued switching operation of the DC-DC converter. The frequency-proportional bias current signal is then provided to operate DC-DC converter controller circuits for intelligent power efficiency to reduce power draw while retaining adequate bandwidth to control the DC-DC conversion during PFM operation. The DLL circuit in one example includes a monostable multivibrator to provide a pulse output signal in response to an edge of the first signal with a pulse duration set by a control current signal. A phase detector provides output signals according to a phase difference between an edge of the pulse output signal and an edge of the first signal, and an output circuit provides an output signal according to the phase detector output signals and according to an offset signal. The output circuit also provides the bias current signal and the control current signal according to the output signal. The DLL circuit in disclosed examples locks onto the repetition rate or frequency of the PFM to drive the bias current signal to a level that is proportional to the PFM signal repetition rate or frequency.

DETAILED DESCRIPTION

Figure 1:
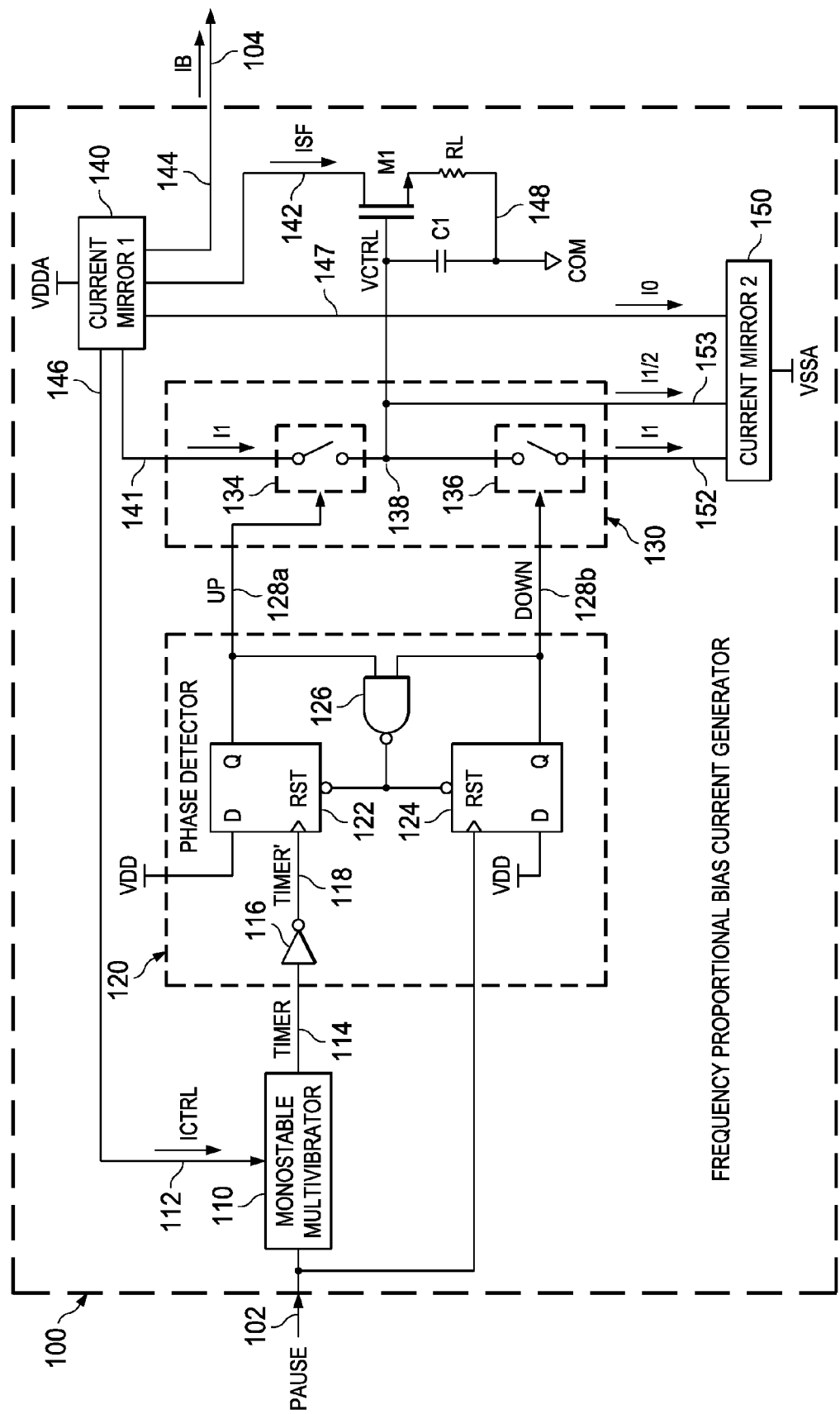
FIG. 1 is a schematic diagram of a circuit to generate a bias current proportional to the frequency of a pulse frequency modulation signal of a switching power converter.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the terms "couple", "couples", or "coupled" are intended to include indirect or direct electrical or mechanical connection or combinations thereof. For example, if a first device couples to or is coupled with a second device, that connection may be through a direct electrical connection, or through an indirect electrical connection via one or more intervening devices and connections.

FIG. 1 shows a bias current generator circuit 100 having an input 102 and an output 104. The circuit 100 generates a bias current signal IB at the output 104 which is proportional to the frequency of a pulse frequency modulation signal PAUSE received at the input 102 from a switching power converter. DC-DC converter control circuit quiescent bias current levels can be set to accommodate a specific bandwidth at a given PFM pause repetition frequency for low output current operation, but the length of the pause period during which the converter is idle may vary by several time decades during PFM operation. The variance in the PFM mode pause time duration across several time decades makes it difficult or impossible to use a constant quiescent bias current which satisfies wake up time specifications while enhancing or optimizing bandwidth and energy efficiency for all PFM frequency conditions. The circuit 100 provides a solution to adjust the quiescent bias current IB according to the PFM repetition frequency. The frequency proportional bias current can be employed to advantageously mitigate excessive DC-DC power loss during PFM operation for enhanced energy efficiency, while adapting the control circuit bandwidth.

Various DC-DC converter control circuits and components consume relatively large amounts of quiescent current during PFM pause conditions and thus are the predominant energy efficiency concern. Many of these circuits must also meet stringent bandwidth and response time performance requirements. One example is a main pulse width modulation (PWM) comparator or modulator circuit used in generating switching control signals to operate the DC-DC converter. Another example is an error amplifier used in comparing feedback values with setpoints or reference signals to implement PWM switching. The disclosed frequency proportional bias current generator circuit 100 in FIG. 1 facilitates intelligent adjustment of bandwidth/quiescent current by providing the bias current signal IB at the output 104 as a proportional function of the PFM pause duration. The resulting bias current signal IB is proportional to the PFM frequency and hence inversely proportional to the PFM pause duration. This reference current signal IB is provided as a bias current for one or more circuits in the DC-DC converter controller as further illustrated in the example of FIG. 3 below. Using the generated current signal IB as a bias for the converter control circuits allows the bandwidth and their wake up time to track the frequency at which they have to function. The described solutions facilitate operation of a DC-DC converter over a potentially wide output current range, while achieving enhanced power efficiency at low output current operating conditions.

The circuit 100 in FIG. 1 includes a monostable multivibrator circuit 110, a phase detector circuit 120, a charge pump circuit 130 with offset circuitry, a voltage to current converter circuit M1, RL, and first and second current mirror circuits 140 and 150 that form a self-biased delay lock loop (DLL) circuit. The DLL circuit generates the bias current signal IB proportional to a repetition frequency or repetition rate of a first signal PAUSE received at the input 102. The first signal PAUSE can be received from any suitable source, such as control circuitry operating a DC-DC converter circuit. The first signal PAUSE has a first state (e.g., low) that represents continuous switching operation of a DC-DC converter circuit, and a second state (e.g., high) that represents discontinued switching operation of the DC-DC converter circuit. The monostable multivibrator circuit 110 has an input that receives the first signal PAUSE. The monostable multivibrator circuit 110 includes an output 114 that provides an output pulse signal TIMER having a rising edge triggered by a rising edge of the PAUSE signal. The monostable multivibrator circuit 110 also includes a control input 112 that receives a control current signal ICTRL to control the pulse duration of the output pulse signal TIMER. The DLL circuit provides the control current signal ICTRL proportional to the repetition frequency of the PAUSE signal, and the offset circuitry in certain examples advantageously adjusts the level of the control current signal ICTRL to provide the TIMER signal with a duty cycle of approximately 50%.

The phase detector circuit 120 can be implemented by a variety of different circuit configurations. The TIMER signal is provided to an inverter 116 of the phase detector circuit 120. An output 118 of the inverter 116 provides the inverted signal TIMER' to a clock input of a first data (D) flip-flop 122 in the phase detector 120. A second D flip-flop 124 has a clock input that receives the first signal PAUSE. The data inputs "D" of the flip-flops 122 and 124 are connected to a supply voltage VDD (logic high in this example). An output 128A of the first flip-flop 122 ("Q" flip-flop output) provides a first phase detector output signal UP in a first state (e.g., high) in response to the falling edge of the output pulse signal TIMER. The "Q" output of the second flip-flop 124 is connected to a second output 128B of the phase detector 120. The output 128B provides a second phase detector output signal DOWN in a first state (e.g., high) in response to the rising edge of the first signal PAUSE. The flip-flops 122 and 124 in FIG. 1 are reset by the active low output of a NAND gate 126, whose inputs are connected to the flip-flop outputs 128A and 128B.

A control capacitor C1 is connected to a control node 138 at the output of the charge pump circuit 130 to provide a control voltage output signal VCTRL. The charge pump circuit 130 includes a first switching circuit 134 that operates when the UP signal is high to connect a first current mirror circuit output 141 to the control node 138 to source a first current I1 to the control node 138. The current mirror circuit 140 delivers the first current I1 from a first analog supply reference voltage VDDA to the switching circuit 134, and the first current I1 in certain examples is proportional to the PFM frequency. A second switching circuit 136 selectively connects an output 152 of a second current mirror circuit 150 to the control node 138 to sink a second current (e.g., also I1 in this example) from the control node 138 when the second phase detector output signal DOWN is high. The second current mirror circuit 150 sinks the current I1 from the control node 138 through the switching circuit 136 to a second analog supply reference voltage VSSA. The first and second currents are equal in one example, both having a value labeled I1 in FIG. 1, which is proportional to the PFM repetition rate or frequency of the PAUSE signal. A further output 153 of the second current mirror circuit 150 is connected to the control node 138 to sink a third current from the control node 138 to implement an offset circuit. In one example, the third current is half the value of the first current (e.g., I1/2) to facilitate generation of the TIMER and TIMER' signals with a 50% duty cycle. In addition, the second current mirror circuit 150 includes an input connected to an output 147 of the first current mirror circuit 140 to receive an input current I0 that is proportional to the PFM repetition rate. The second current mirror circuit 150 controls the levels I1 and I1/2 of the sink currents at the outputs 152 and 153 proportional to the I0 signal from the first current mirror circuit 140. In this manner, the charge pump currents provided to or from the control node 138 are proportional to the control voltage output signal VCTRL, and thus proportional to the frequency of the PAUSE signal.

The voltage to current converter circuit in FIG. 1 is implemented by a transistor M1 and a resistor RL configured as a source follower. The transistor M1 generates an output current signal ISF that is proportional to the control voltage output signal VCTRL. Any suitable voltage to current converter circuit can be used. M1 in one example is an NMOS transistor, although other transistor types can be used. A drain of M1 is connected to an input 142 of the current mirror circuit 140, and the resistor RL is connected between the source of M1 and a common reference node 148 (labeled "COM" in the drawing). The source follower circuit converts the control voltage output signal VCTRL to control the output current signal ISF conducted from the current mirror circuit 140. The current mirror circuit 140 provides the bias current signal IB proportional to the output current signal ISF at an output 144. The current mirror circuit 140 also provides the control current signal ICTRL at an output 146 to the control input 112 of the monostable multivibrator circuit 110 proportional to the output current signal ISF. The output control signal ICTRL, in turn, controls the pulse duration of the output pulse signal TIMER.

When the UP signal is high, the control capacitor C1 is charged by current from the current mirror output 141. When the DOWN signal is high, the second current mirror circuit 150 discharges the control capacitor C1 by removing an equal current I1 from the control node 138 via the output 152. In addition, the second current mirror circuit 150 provides offset circuitry to constantly discharge the capacitor by removing or sinking the third current I1/2 via the output 153. Due to the additional half charge pump current I1/2 flowing out of the control node 138, the DLL loop will create a 50% duty cycle signal TIMER at the output of the monostable multivibrator circuit 110 at the frequency of the PAUSE signal. Also, because the monostable multivibrator circuit 110 is linearly controlled by the current ICTRL, the current IB created by the circuit 100 is proportional to the PFM pause signal frequency. The DLL circuit is a first order system so the only criteria for stability is for its bandwidth to be lower than the switching frequency. The DLL circuit in certain examples can be designed to operate over several frequency decades. The charge pump 130 in one example is self-biased with the current it generates by operation of the current mirrors 140 and 150 to control the current values I1 and I1/2 according to the source follower current ISF, proportional to the control voltage VCTRL. The pole p of the system at the output of the charge pump 130 and can be expressed as $p=I1/(2*\pi*C1)$. Since the frequency of this pole is proportional to the charge pump bias current I1, and since a current proportional to the switching frequency is used to bias the charge pump 130, the pole of the system will adapt to the PAUSE signal repetition frequency to provide an adapted bandwidth across several frequency decades.

Figure 2:
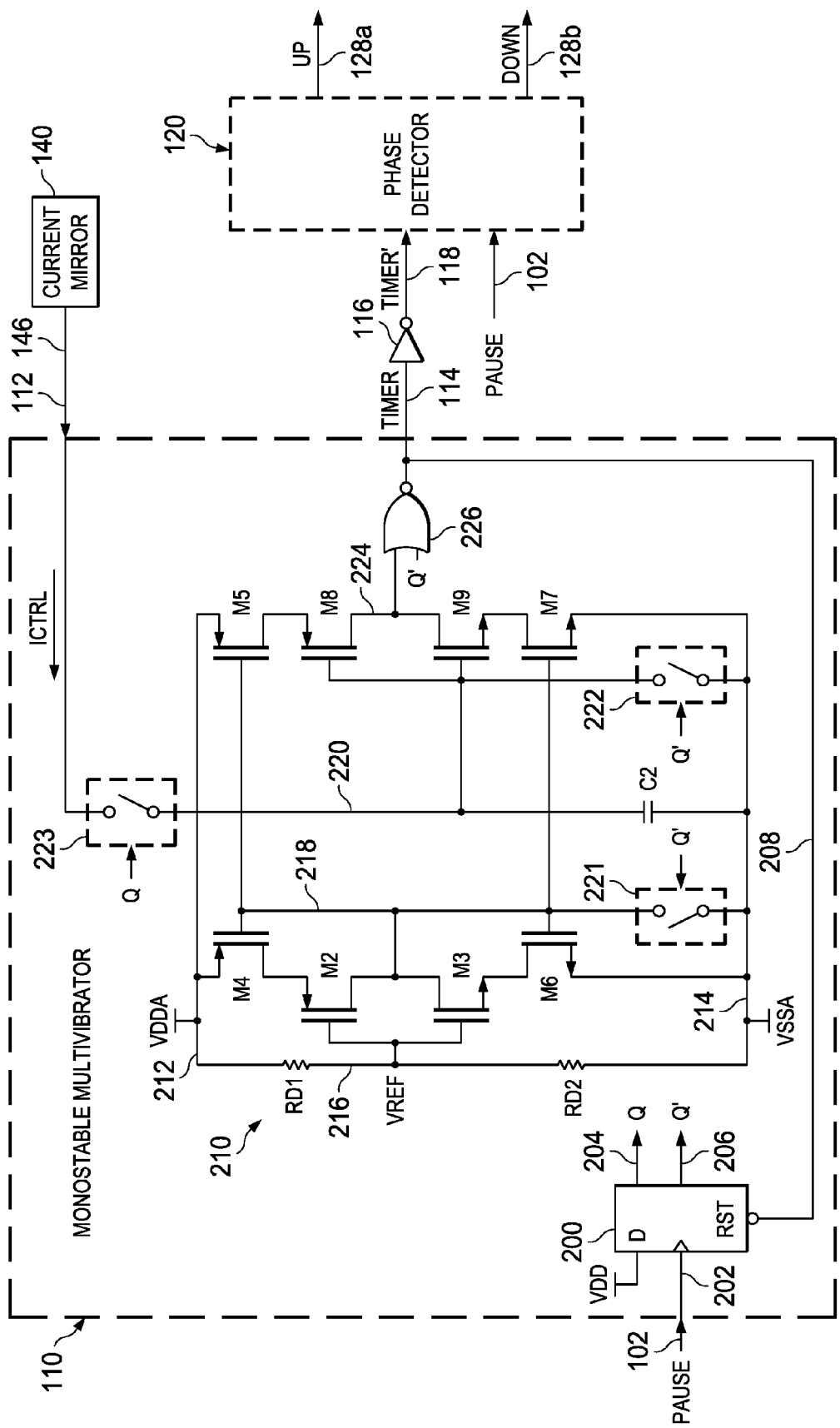
FIG. 2 is a schematic diagram of a monostable multivibrator circuit in the bias current generator of FIG. 1.

FIG. 2 shows an example monostable multivibrator circuit 110 which can be used in the bias current generator of FIG. 1. The circuit 110 includes a D flip-flop 200 with a clock input 202 that receives the PAUSE signal from the bias current generator input 102. The flip-flop 200 provides a normal data output signal "Q" at an output 204, and an inverted output "Q" at a second output 206. A reset input (RST) of the flip-flop 200 is driven by the TIMER signal on line 208 from the output 114 of the monostable multivibrator circuit 110. The circuit 110 also includes a comparator circuit 210 connected between the analog supply voltage node VDDA at line 212 and the second analog supply VSSA at line 214. A resistor divider circuit is formed by resistors RD1 and RD2 connected between the lines 212 and 214 to provide a reference voltage signal VREF at an input node 216 of the comparator circuit 210. A CMOS input stage is formed by transistors M2 and M3 to receive the voltage reference signal VREF, and the corresponding CMOS circuit output node 218 is connected to gate terminals of PMOS transistors M4 and M5 and to the gates of NMOS transistors M6 and M7. A switch 221 is connected between the node 218 and VSSA and operates according to the Q' signal to reset the reference side of the comparator circuit 210.

The comparator circuit 210 includes a second input node 220 connected to the current mirror output 146 through a switch 223. The switch 223 operates according to the Q signal from the flip-flop 200 to selectively deliver the current control signal ICTRL to the second input node 220. A multivibrator capacitor C2 is connected between the second input node 220 and VSSA to control the voltage at the node 220. A switch 222 is connected between the node 220 and VSSA in parallel with the capacitor C2. The switch 222 operates according to the Q' signal to discharge the capacitor C2 to reset the voltage at the second input node 220. The voltage across C2 is provided as a gate control signal to a CMOS output formed by a PMOS transistor M8 and an NMOS transistor M9 connected between M5 and M7. The output transistor pair M8 and M9 have drains connected to an output node 224 that provides an input signal to a NOR gate 226. The Q' signal is provided to the other input of the gate 226, and the output of the gate 226 provides the TIMER signal at the multivibrator output 114.

After the comparator circuit 210 is reset by the switches 221 and 222, the next rising edge of the signal PAUSE causes the flip-flop Q signal to go high, and the Q' signal to go low. In this state, the current ICTRL charges the capacitor C2 until the voltage at the node 220 turns on M9 to bring the voltage at the NOR gate input 224 low. The output of the NOR gate 226 goes high, causing a rising edge and the TIMER signal at the multivibrator output 114. The high state of the TIMER signal resets the flip-flop 200, causing the Q signal to again go low, and the Q' signal to go high. This resets the comparator circuit 210 by closing the switches 221 and 222, and opening the switch 223. The multivibrator circuit 110 controls the pulse width of the TIMER output signal according to the level of the control current signal ICTRL. In closed loop operation of the DLL circuit of FIG. 1, reducing the control current signal ICTRL extends the TIMER signal pulse width or pulse duration because more time is required to charge the capacitor C2 in the multivibrator circuit 110. Conversely, increasing ICTRL charges the capacitor C2 faster, and thus shortens the duration of the TIMER signal pulses.

Figure 3:
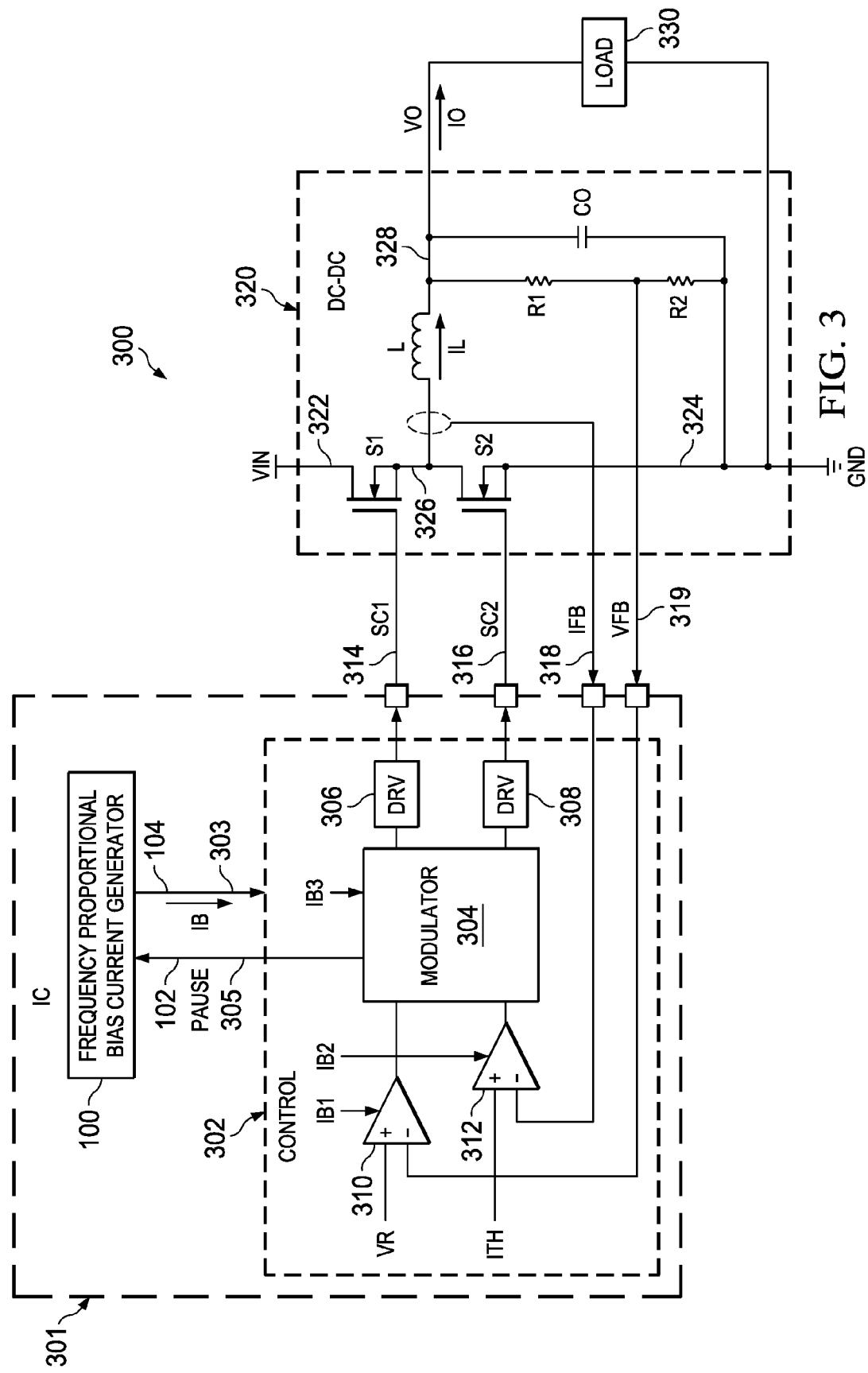
FIG. 3 is a schematic diagram of a buck DC-DC converter system with a PWM control integrated circuit including the bias current generator that of FIG. 1 to provide a frequency proportional bias current to a converter control circuit.

Referring now to FIG. 3, the frequency proportional bias current generator circuit 100 of FIG. 1 can be used in combination with a variety of different DC-DC converter systems. FIG. 3 shows an example buck DC-DC converter system 300 with a DC-DC converter circuit 320. The system 300 includes a PWM controller integrated circuit (IC) 301 with a bias current generator circuit 100 as described above to provide a frequency proportional bias current IB to a PWM control circuit 302. The control circuit 302 includes a modulator circuit 304 that provides pulse width modulated signals to first and second driver circuits 306 and 308. The drivers 306 and 308 respectively provide first and second switching control signals SC1 and SC2 at IC outputs 314 and 316 to operate switches S1 and S2 of the DC-DC converter 320. The modulator 304 operates from a bias current IB3 derived from the 1B signal.

The modulator circuit 304 includes an output 305 that provides the PAUSE signal to the input 102 of the frequency proportional bias current generator circuit 100 as described above. The modulator 304 in one example provides the PAUSE signal as a logical AND of the PWM signals provided to the drivers 306 and 308, where the drivers 306 and 308 are inverters, with a certain amount of hysteresis, such that the signal PAUSE is in a first (e.g., low) state when the PWM signals are providing generally continuous switching operation of the DC-DC converter circuit 320, and a second state (e.g., high) representing discontinued switching operation of the DC-DC converter circuit 320. In this example, therefore, the PAUSE signal is in the second state when S1 and S2 are off during PFM and DCM operation of the DC-DC converter circuit 320, and PAUSE is in the first state during CCM operation. As previously discussed, this condition involves little or no switching of the converter switches S1 and S2, and the bias generator circuit 100 advantageously reduces the bias current signal IB provided to a bias current input 303 of the control circuit 302.

The bias current IB from the bias current generator circuit 100 is used by the control circuit 302 in order to deliver the bias current IB3 to the modulator 304, and may be also used to deliver bias currents IB1 and IB2 to other circuit components within the circuit 302. In the illustrated example, the control circuit includes a first comparator 310 operating from the bias current IB1 to compare a voltage reference signal VR to a feedback voltage signal VFB from an IC input 319 for use by the modulator 304 in regulating an output voltage VO of the DC-DC converter 320. In addition, this example includes a second comparator 312 operating from the bias current IB2. The second comparator 312 compares a current threshold ITH with a current feedback signal IFB received at an IC input 318 from the DC-DC converter circuit 320.

The DC-DC converter switching devices S1 and S2 operate according to the switching control signals SC1 and SC2 to convert DC input voltage VIN to provide a controlled DC output voltage VO to drive a load 330. The buck converter configuration includes a first converter switching device S1 coupled between an input voltage node 322 and a switching node 326. The second switching device S2 is connected between the switching node 326 and an output reference voltage node 324 (labeled GND in the drawing). An output inductor L is connected between the switching node 326 and an output node 328 in the buck configuration. An output capacitor CO is connected between the output node 328 and the reference voltage node 324. In operation, the control circuit 302 provides alternating pulse width modulated switching control signals SC1 and SC2 in order to turn on S1 to magnetize the inductor L, and then to turn S1 off while turning on S2 in CCM operation for relatively high output current requirements. The inductor L conducts current IL from the switching node 326 to charge the output capacitor CO. Turning on S2 allows current to flow through the inductor L and the output capacitor CO, with the alternate operation of S1 and S2 maintaining a regulating the output voltage VO across the capacitor CO. A current sensor senses the inductor current IL to provide the current feedback signal IFB to the IC input 318 for comparison with a threshold ITH via the comparator 312. A resistive divider network provides the voltage feedback signal VFB to the comparator 310 as a voltage in a node joining resistors R1 and R2 connected in series with one another in parallel with the output capacitor CO. Controlled operation of the converter circuit 320 drives the load 330 with output current IO.

Figure 4:
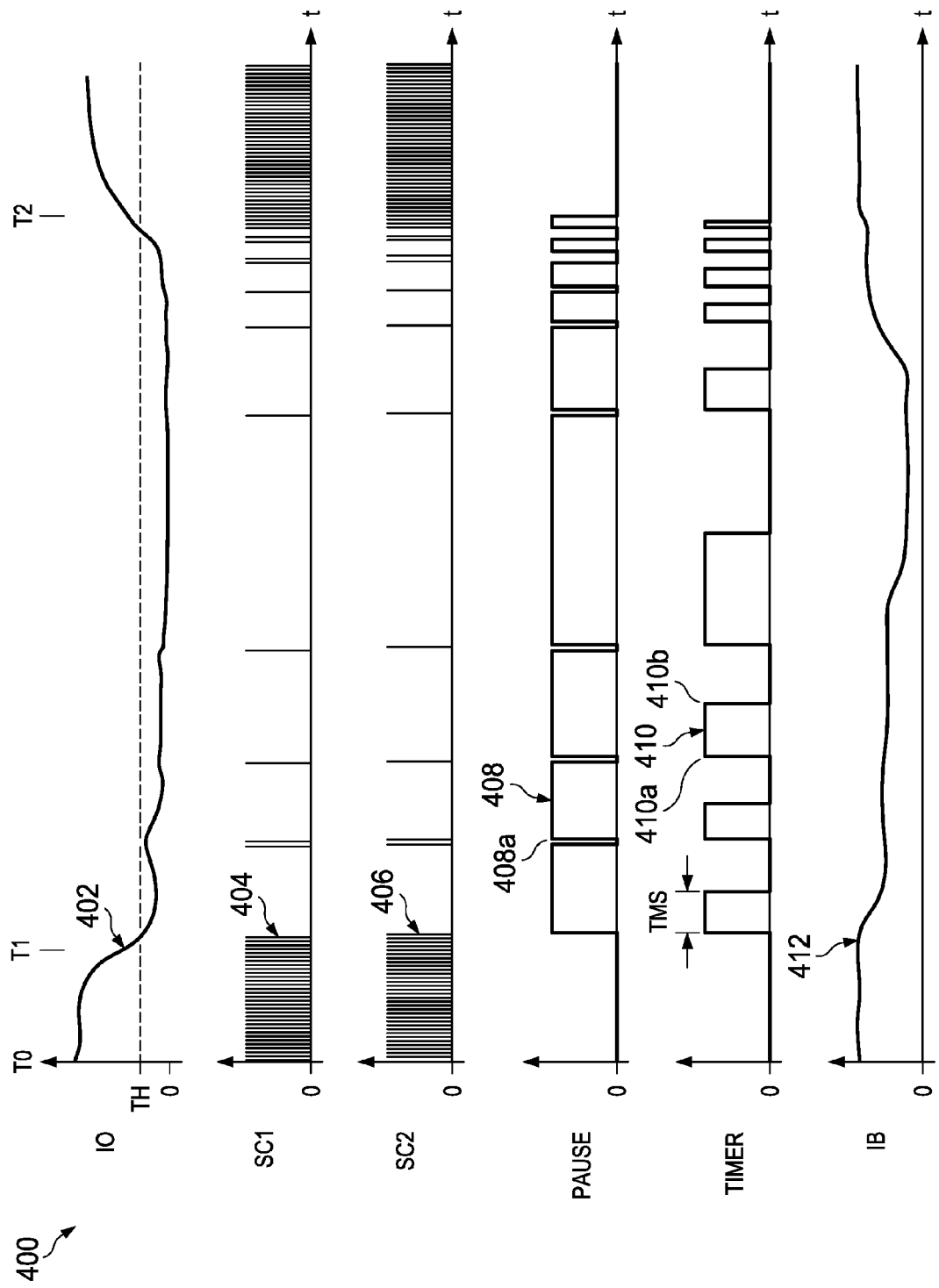
FIG. 4 is a waveform diagram showing various signals in the circuits of FIGS. 1-3.

Referring also to FIG. 4, a waveform diagram 400 illustrates various signals in the DC-DC converter system 300 of FIG. 3 and the frequency proportional bias current generator circuit 100 of FIG. 1. FIG. 4 illustrates an output current curve 402 (IO) as a function of time during operation of the DC-DC converter circuit 320. Curves 404 and 406 show the first and second switching control signals SC1 and SC2, respectively. A curve 408 in FIG. 4 shows the PAUSE signal provided from the converter control circuit 302 to the bias current generator circuit 100. As seen in FIG. 4, the PAUSE signal includes rising edges 408a. A curve 410 illustrates the TIMER signal with rising and falling edges 410a and 410b, respectively. The TIMER signal is provided at the output 114 of the monostable multivibrator circuit 110 in FIG. 1. In addition, FIG. 4 shows a bias current curve 412 illustrating the frequency proportional bias current IB provided by the current generator circuit 100 to the control circuit 302 in FIG. 3 as a function of time t.

When the output current IO required by the load 330 in FIG. 3 is relatively high from time T0 through T1 in FIG. 4, the control circuit 302 provides the switching control signals in curves 404 and 406 for continuous conduction mode (CCM) operation. In this CCM mode, the PAUSE signal and the TIMER signal are low.

When the output or load current curve 402 falls below a threshold TH at T1 in FIG. 4, the control circuit 302 enters discontinuous mode or PFM operation, with timer periods in which neither of the switching control signals SC1 or SC2 are active (curves 404 and 406 at zero). This causes a relatively long PAUSE pulse in the curve 408. The monostable multivibrator circuit 110 provides a corresponding TIMER a pulse signal of approximately 50% duty cycle, with a pulse duration TMS. After T1, the self-biased DLL circuit tracks the repetition frequency of the PAUSE signal and provides proportional bias current IB to deliver quiescent current to the control circuit 302, which decreases in this example. The self-biased DLL circuit uses the PAUSE signal to trigger the current controlled variable monostable circuit 110 and provides the feedback signal ICTRL so that the width or duration of the pulsed signal TIMER is linearly controlled by the source follower current ISF and thus by the control voltage signal VCTRL. As the converter switching operation becomes less frequent after T1 in FIG. 4, the frequency of the PAUSE signal is further reduced, and the bias current generator circuit 100 provides a proportionally lower bias current signal IB, seen as further decreases in the curve 412. In this example, the PAUSE signal frequency tracks the output current consumed by the load 330 as shown in the curves 402 and 408. The corresponding reduction in the bias current curve 412 helps reduce energy consumption at light output current loads of a DC-DC converter 320 where the control circuit quiescent current consumption by modulators and/or fast response comparators is the dominant power loss mechanism.

During PFM or DCM operation as the load current IO decreases, the frequency of the PAUSE signal decreases. In this condition, the PAUSE edges will lag the corresponding TIMER signal edges, and the phase detector circuit 120 provides DOWN pulses to discharge the capacitor C1 and reduce the VCTRL signal level. The source follower circuit M1, RL proportionally reduces the current signal ISF, causing a reduction in the IB and ICTRL current signals through operation of the current mirror circuit 140. A reduced current control signal ICTRL, in turn, reduces the frequency of the TIMER signal, and causes an increase in the corresponding duration of the TIMER pulses. The load current slightly increases in FIG. 4 during PFM operation, resulting in gradual reduction in the duration of the PAUSE signal pulses, with the vibrator circuit 110 providing 50% duty cycle pulses of gradually increasing frequency. At T2 in FIG. 4, the load current curve 402 transitions above the threshold TH, and the control circuit 302 resumes CCM operation thereafter.

Disclosed examples utilize self-biased DLL locking on the PAUSE repetition frequency to produce a PFM repetition proportional current IB to facilitate high efficiency even during low load current operation of the DC-DC converter 320. The bias current generator circuit 100 in certain examples is a single pole loop, offering inherent stability with an adaptive or sliding pole. The dynamic frequency range is only limited by the leakage performance of the FETs used to implement the various current sources and sinks of the charge pump 130 or the monostable multivibrator circuit 110. The disclosed circuits and techniques also advantageously adapt the control circuit current consumption for low frequency and the bias current consumption is increased proportionally to the PFM repetition frequency. As a result, the circuit 100 has little or no adverse impact on efficiency performance due to its own consumption but can greatly improve efficiency by optimizing the bias currents of one or more circuits or components in the DC-DC converter system 300 over several decades of operating frequency without sacrificing bandwidth or response time.

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

The following is claimed:

1. A power conversion system, comprising:
   a DC-DC converter circuit, including:
   a first switching device coupled between a DC input node and a switching node, the first switching device operative according to a first switching control signal, and
   a second switching device coupled between the switching node and a reference voltage node, the second switching device operative according to a second switching control signal;

a control circuit, including:
first and second driver outputs to provide the first and second switching control signals according to a feedback signal to regulate an output voltage signal of the DC-DC converter circuit,
a bias current input to receive a bias current signal to operate a component of the control circuit, and
a signal output to provide a first signal having a first state representing continuous switching operation of the DC-DC converter circuit and a second state representing discontinued switching operation of the DC-DC converter circuit; and
a self-biased delay lock loop (DLL) circuit to generate the bias current signal proportional to a repetition frequency of the first signal.

2. The power conversion system of claim 1, wherein the DLL circuit includes:
a monostable multivibrator circuit to provide a pulse output signal in response to a detected edge of the first signal, the monostable multivibrator circuit linearly controlling a pulse duration of the pulse output signal according to a control current signal;
a phase detector circuit to provide first and second phase detector output signals according to a phase difference between an edge of the pulse output signal and the first signal; and
an output circuit to provide an output signal according to the first and second phase detector output signals and according to an offset signal, to provide the bias current signal according to the output signal, and to provide the control current signal according to the output signal.

3. The power conversion system of claim 2, wherein the output circuit includes:
a capacitor connected to a control node to provide the output signal as a control voltage output signal at the control node;
a charge pump circuit configured to selectively source a first current to the control node when the first phase detector output signal is in a first state, to selectively sink a second current from the control node when the second phase detector output signal is in a first state;
a current sink circuit to provide the offset signal by sinking a third current from the control node;
a voltage to current converter circuit to generate an output current signal proportional to the control voltage output signal; and
a current mirror circuit coupled with the voltage to current converter circuit to generate the bias current signal proportional to the output current signal, and to provide the control current signal proportional to the output current signal to the control input of the monostable multivibrator circuit to control the pulse duration of the output pulse signal.

4. The power conversion system of claim 3,
wherein the charge pump circuit includes:
a first switching circuit to selectively connect a first output of the current mirror circuit to the control node to source the first current to the control node when the first phase detector output signal is in the first state, and
a second switching circuit to selectively connect a second output of the current mirror circuit to the control node to sink the second current from the control node when the second phase detector output signal is in the first state; and wherein the current sink circuit is a third output of the current mirror circuit connected to the control node to sink the third current from the control node.

5. The power conversion system of claim 4, wherein the first current is equal to the second current; and wherein the third current is half the first current.

6. The power conversion system of claim 3, wherein the first current is equal to the second current; and wherein the third current is half the first current.

7. An integrated circuit (IC) to operate a DC-DC converter circuit, the IC comprising:
a control circuit, including:
a driver circuit to provide a switching control signal to operate a switch of the DC-DC converter circuit according to a feedback signal to regulate an output voltage signal of the DC-DC converter circuit,
a bias current input to receive a bias current signal to operate a component of the control circuit, and
a signal output to provide a first signal having a first state representing continuous switching operation of the DC-DC converter circuit and a second state representing discontinued switching operation of the DC-DC converter circuit; and
a self-biased delay lock loop (DLL) circuit to generate the bias current signal proportional to a repetition frequency of the first signal.

8. The IC of claim 7, wherein the DLL circuit includes:
a monostable multivibrator circuit to provide a pulse output signal in response to a detected edge of the first signal, the monostable multivibrator circuit linearly controlling a pulse duration of the pulse output signal according to a control current signal;
a phase detector circuit to provide first and second phase detector output signals according to a phase difference between an edge of the pulse output signal and the first signal; and
an output circuit to provide an output signal according to the first and second phase detector output signals and according to an offset signal, to provide the bias current signal according to the output signal, and to provide the control current signal according to the output signal.

9. The IC of claim 8, wherein the output circuit includes:
a capacitor connected to a control node to provide the output signal as a control voltage output signal at the control node;
a charge pump circuit configured to selectively source a first current to the control node when the first phase detector output signal is in a first state, to selectively sink a second current from the control node when the second phase detector output signal is in a first state;
a current sink circuit to provide the offset signal by sinking a third current from the control node;
a voltage to current converter circuit to generate an output current signal proportional to the control voltage output signal; and
a current mirror circuit coupled with the voltage to current converter circuit to generate the bias current signal proportional to the output current signal, and to provide the control current signal proportional to the output current signal to the control input of the monostable multivibrator circuit to control the pulse duration of the output pulse signal.

10. The IC of claim 9,
wherein the charge pump circuit includes:
a first switching circuit to selectively connect a first output of the current mirror circuit to the control node to source the first current to the control node when the first phase detector output signal is in the first state, and a second switching circuit to selectively connect a second output of the current mirror circuit to the control node to sink the second current from the control node when the second phase detector output signal is in the first state; and wherein the current sink circuit is a third output of the current mirror circuit connected to the control node to sink the third current from the control node.

11. The IC of claim 10, wherein the first current is equal to the second current; and wherein the third current is half the first current.

12. The IC of claim 9, wherein the first current is equal to the second current; and wherein the third current is half the first current.

\* \* \* \* \*